(12) United States Patent
Tao et al.

(10) Patent No.: US 10,404,271 B1
(45) Date of Patent: Sep. 3, 2019

(54) BIPHASE MARK CODING TRANSMITTER

(71) Applicant: LONTIUM SEMICONDUCTOR CORPORATION, Hefei Anhui (CN)

(72) Inventors: Cheng Tao, Hefei Anhui (CN); Xi Xu, Hefei Anhui (CN); Xiangyu Ji, Hefei Anhui (CN); Jiaxi Fu, Hefei Anhui (CN)

(73) Assignee: LONTIUM SEMICONDUCTOR CORPORATION, Hefei Anhui (CN)

( * ) Notice: Subject to any disclaimer, the term of this patent is extended or adjusted under 35 U.S.C. 154(b) by 0 days.

(21) Appl. No.: 16/013,447

(22) Filed: Jun. 20, 2018

(30) Foreign Application Priority Data

May 18, 2018 (CN) .......................... 2018 1 0478207

(51) Int. Cl.
*H03M 5/12* (2006.01)
*H03M 1/08* (2006.01)
*H04B 1/04* (2006.01)

(52) U.S. Cl.
CPC .............. *H03M 5/12* (2013.01); *H03M 1/08* (2013.01); *H04B 1/0475* (2013.01)

(58) Field of Classification Search
CPC ....................................... H03M 5/12

USPC ......................................... 375/308
See application file for complete search history.

(56) References Cited

U.S. PATENT DOCUMENTS 4,468,784 A * 8/1984 Jagnow ................ H04B 1/7085
375/150

\* cited by examiner

*Primary Examiner* — Lihong Yu
(74) *Attorney, Agent, or Firm* — Cantor Colburn LLP

(57) ABSTRACT

A biphase mark coding transmitter is provided. In the biphase mark coding transmitter, a delay control unit performs equal-interval delay processing on data transmitted by a data coding and protocol processing unit. Then, the current-steering digital-to-analog converter is controlled to charge or discharge a resistance-capacitance circuit to obtain an accurately-controlled conversion time. Data with the controlled conversion time is driven to a CC by a unity-gain buffer to generate an output waveform. The technical solution solves the technical problem of a mutual influence between power source systems of a traditional BMC transmitter which is a digital module and a traditional BMC receiver which is an analog module, and the technical problem of a large noise of a power switch and large consumption of chip area and power which are resulted from digital buffers driven by equal-interval data or clocks in a traditional BMC transmitter.

4 Claims, 6 Drawing Sheets

BIPHASE MARK CODING TRANSMITTER

CROSS REFERENCE TO RELATED APPLICATION

The present application claims priority under 35 U.S.C. § 119 to Chinese Patent Application No. 201810478207.8, filed on May 18, 2018, the entire contents of which are incorporated herein by reference.

FIELD

The present disclosure related to the technical field of circuit design, and in particular to a biphase mark coding transmitter.

BACKGROUND

At present, the Type-C, as an emerging Universal Serial Bus (USB) interface standard under the support of the USB-PD protocol, can provide a high data transmission speed, a high online power supply capability and a simple and convenient system connection, and supports a simultaneous transmission of USB3.1 data and video data of multiple types such as the DisplayPort (DP), the High Definition Multimedia Interface (HDMI) and the Mobile High-Definition Link (MHL). According to the USB-PD specification, a Type-C connection between an upstream device and a downstream device is implemented by performing a communication on a Configuration Channel (CC) based on a Biphase Mark Coding (BMC) mechanism, and a rising edge or falling edge of a to-be-transmitted waveform obtained by the BMC is specified strictly in the USB-PD protocol. However, due to an indeterminacy of a parasitic parameter of a Type-C connection system, the rising edge or falling edge of the to-be-transmitted waveform should be designed as regulatable, so as not to depend on a system connection attribute while conforming to the USB-PD standard.

Referring to FIG. 1, a traditional BMC transmitter having a conversion speed control function is shown. Signals d1 to dn at an equal interval are obtained by performing an n-stage clock sampling on input data di (the interval is equal to the clock period Tck). Then, the signals d1 to dn at the equal interval are respectively transmitted to buffers BUF1 to BUFn to switch on the n BUFs successively to drive output, thereby generating the output waveform with controlled rising edge or falling edge, as shown in the upper part of FIG. 2. The conversion speed can be changed by changing a clock frequency, i.e., the clock period Tck. The lower part of FIG. 2 shows waveforms corresponding to a light load and a heavy load. Apparent rising edge steps and falling edge steps can be seen in the figure. The steps are filtered by a filter in practices, to obtain a smooth rising edge and a smooth falling edge. However, such traditional BMC transmitter has disadvantages as follows. As components of a BMC transceiver, a BMC transmitter is a digital circuit while a receiver is an analog circuit. Therefore, in design, a power source and ground for the BMC transmitter should be isolated from a power source and ground for the receiver, to prevent a mutual influence between power source systems of the digital module and the analog module. In the structure of the traditional BMC transmitter (as shown in FIG. 1), the regulation of the rising edge or falling edge are controlled by several clocks at an equal interval or by several stages of sampled data. However, what are driven by the equal-interval data or clocks are digital buffers, thereby causing a large noise of a power switch and consuming a large chip area and power.

SUMMARY

A biphase mark coding (BMC) transmitter is provided according to the present disclosure, to solve the technical problem of a mutual influence between power source systems of a traditional BMC transmitter which is a digital module and a traditional BMC receiver which is an analog module, and the technical problem of a large noise of a power switch and large consumption of chip area and power which are resulted from digital buffers driven by equal-interval data or clocks in a traditional BMC transmitter.

The following technical solutions are provided according to the present disclosure.

A BMC transmitter includes: a delay control unit, a current-steering digital-to-analog converter, a resistance-capacitance circuit and a unity-gain buffer.

An input end of the delay control unit is connected to a data coding and protocol processing unit. The delay control unit is configured to receive a to-be-transmitted data txd file obtained by the data coding and protocol processing unit performing a coding, a cyclical redundancy check and a universal serial bus power delivery (USB-PD) protocol layer control, perform an equal-interval sampling on the to-be-transmitted data txd file to obtain n data signals at an equal interval, and transmit the n data signals to the current-steering digital-to-analog converter, where n is a positive integer greater than or equal to 2.

An input end of the current-steering digital-to-analog converter is connected to an output end of the delay control unit. An input end of the resistance-capacitance circuit is connected to an output end of the current-steering digital-to-analog converter. Current units in the current-steering digital-to-analog converter are switched on or switched off successively under the control of the n data signals at the equal interval, to charge or discharge the resistance-capacitance circuit to obtain accurately-controlled conversion time.

An output end of the resistance-capacitance circuit is connected to an input end of the unity-gain buffer. The unity-gain buffer is configured to drive the data with controlled conversion time to a configuration channel to generate an output waveform. An output end of the unity-gain buffer serves as an output end of the biphase mark coding transmitter to output the output waveform.

In an embodiment, the delay control unit includes n D-triggers.

The n D-triggers are connected in cascade. An input to the D-trigger of each stage is from an output of the D-trigger of a previous stage, and an output end of the D-trigger of each stage serves as the output end of the delay control unit and is connected to the input end of the current-steering digital-to-analog converter. An input end of the D-trigger of the first stage serves as the input end of the delay control unit and is connected to an output end of the data coding and protocol processing unit.

The n D-triggers are configured to generate the n data signals at the equal interval under a control of a clock, and transmit the n data signals at the equal interval to the current-steering digital-to-analog converter.

In an embodiment, the current-steering digital-to-analog converter includes n current switch arrays, and each of the n current switch arrays includes a current source and a bidirectional switch.

An end of each of the current switch arrays is connected to a power source. One end of the bidirectional switch serves as the input end of the current-steering digital-to-analog converter and is connected to the output end of the delay control unit, and the other end of the bidirectional switch serves as the output end of the current-steering digital-to-analog converter and is connected to the input end of the resistance-capacitance circuit.

In an embodiment, the unity-gain buffer is an operational amplifier. A positive phase input end of the operational amplifier serves as the input end of the unity-gain buffer and is connected to the resistance-capacitance circuit, and a negative phase input end of the operational amplifier is connected to an output end of the operational amplifier to serve as the output end of the unity-gain buffer.

It can be seen from the above technical solutions that, compared with the conventional technologies, in the BMC transmitter according to the present disclosure, the delay control unit performs the equal-interval delay processing on data transmitted by the data coding and protocol processing unit. Then, the current-steering digital-to-analog converter is controlled to charge or discharge the resistance-capacitance (RC) circuit to obtain accurately-controlled conversion time. Data with the controlled conversion time is driven to a CC by the unity-gain buffer to generate the output waveform. The technical solution solves the technical problem of a mutual influence between power source systems of a traditional BMC transmitter which is a digital module and a traditional BMC receiver which is an analog module, and the technical problem of a large noise of a power switch and large consumption of chip area and power which are resulted from digital buffers driven by equal-interval data or clocks in a traditional BMC transmitter.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

The technical solution according to the embodiments of the present disclosure will be described clearly and completely as follows in conjunction with the drawings. It is apparent that the described embodiments are only a few rather than all of the embodiments according to the present disclosure. Any other embodiments obtained by those skilled in the art based on the embodiments in the present disclosure without any creative work fall in the scope of the present disclosure.

The terms used in the description are explained as follows.

The USB Type-C refers to the latest USB interface which is developed by the USB IF organization, which supports both normal plugging and reverse plugging and has a high power supply capability, and can transmit data of multiple video protocols such as the DP, HDMI and MHL.

The USB-PD refers to a USB electric power transmission and communication protocol developed by the USB IF organization, which allows power up to 100 W (20V/5 Å) to be transmitted between USB devices, can change port attributes such as power supplying/receiving and data transmitting/receiving, and can communicate with a USB cable to acquire an attribute of the cable.

CC is short for a Configuration Channel, which is a critical channel newly added to the Type-C interfaces. Upstream-downstream communication is performed by a USB-PD message transmitted on the CC to determine a USB connection, normal or reverse plugging, connection establishment and management of data and VBUS, and the like.

Figure 1:
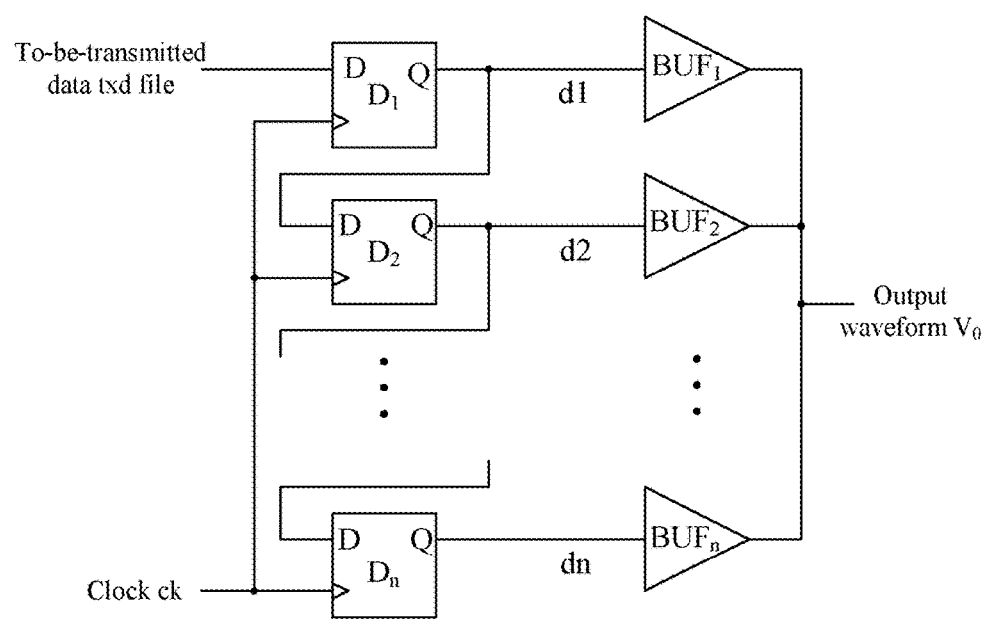
FIG. 1 is a schematic structural diagram of a biphase mark coding (BMC) transmitter according to the conventional technologies.
Figure 2:
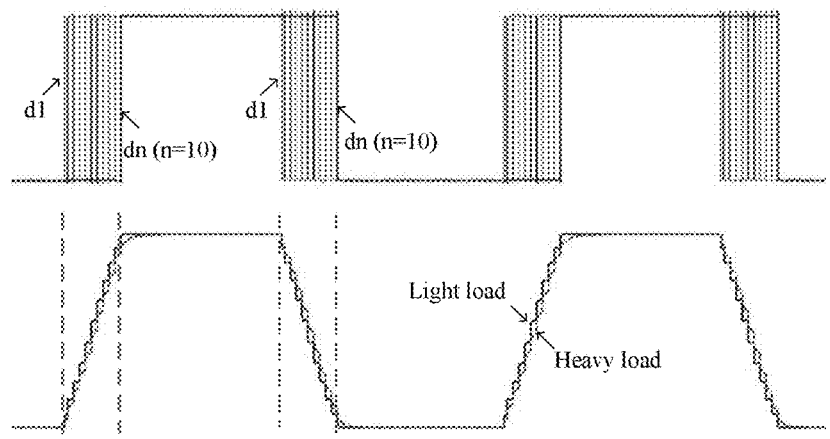
FIG. 2 is a schematic diagram showing an output waveform of a BMC transmitter according to the conventional technologies.
Figure 3:
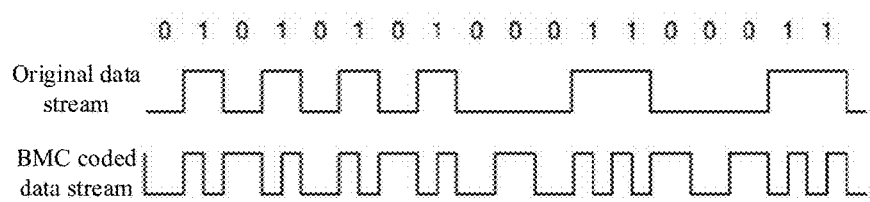
FIG. 3 is a schematic diagram showing an input waveform and an output waveform of a BMC transmitter according to the conventional technologies.

BMC is short for Biphase Mark Coding, which a physical layer coding mechanism for transmitting a USB-PD protocol message. As shown in FIG. 3, a hopping edge exits between two adjacent binary data bits, and a hopping edge also exist at the middle of any data bit of "1", which has an advantage of providing a direct-current (DC) balance characteristic (the data bits of "0" and data bits of "1" having substantially the same number, and the thus DC level is almost 0).

UGB is short for a Unity-Gain Buffer, i.e., a follower, which is an operational amplifier application configuration. In the configuration, a positive (negative) input of an operational amplifier is taken as a UGB signal input, and a negative (positive) input of the operational amplifier being connected to a positive (negative) output of the operational amplifier is taken as a UGB output. The UGB has a feature that an output follows an input, and has a small output impedance and a strong drive capability since the operational amplifier normally has a high gain.

SR is short for a Slew Rate, which indicates a capability that an output signal follows or responds to an input step signal of an operational amplifier. The SR reflects an instant response capability of the operational amplifier, having a unit of a change amount of an output voltage per 1 µs, i.e., V/µs.

The USB Type-C interface is the latest USB interface standard defined by the USB IF organization, in order to meet the development of emerging customer electronic platforms and further expand the application of USB cables and connectors. The USB Type-C interface is designed for new products, having advantages of a smaller size than a conventional data/charging interface USB2.0 Micro-B of a conventional mobile phone, supporting blind mating (both the normal plugging and the reverse plugging are supported, and ports of the cable are exchangable) and high charging power (up to 100 W@20V 5 Å), and providing Alternate Mode to transmit different video data, which expands the function of the interface.

In view of the problem of the structure of a traditional BMC transmitter, in the present disclosure, equal-interval delay processing is performed on data transmitted by the data coding and protocol processing unit under the control of the delay control unit. Then, the current-steering digital-to-analog converter is controlled to charge or discharge an RC circuit to obtain accurately-controlled conversion time. Data with the controlled conversion time is driven to a CC by the unity-gain buffer to generate an output waveform to be outputted by the BMC transmitter.

TABLE 1

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1− | VBUS | CC1 | D+ | D− | SBU1 | VBUS | RX2− | RX2+ | GND |

USB Type C Connector Pin Definition

| GND | RX1+ | RX1− | VBUS | SBU2 | D− | D+ | CC2 | VBUS | TX2− | TX2+ | GND |
|---|---|---|---|---|---|---|---|---|---|---|---|
| B12 | B11 | B10 | B9 | B8 | B7 | B6 | B5 | B4 | B3 | B2 | B1 |

USB Type-C Connector Interface

| Pin | Name | Description | Name | Pin |
|---|---|---|---|---|
| A12 | GND | Ground | GND | B1 |
| A11 | RX2+ | USB3.1RX2 Differential Pair    USB3.1TX2 Differential Pair | TX+ | B2 |
| A10 | RX2− |  | TX2− | B3 |
| A9 | VBUS | USB Type C Power | VBUS | B4 |
| A8 | SUB1 | Sideband Use Channel-1    Configuration Channel-2 | CC2 | B5 |
| A7 | D− | USB 2.0 Differential Pair | D+ | B6 |
| A6 | D+ |  | D− | B7 |
| A5 | CC1 | Configuration Channel-1    Sideband Use Channel-2 | SBU2 | B8 |
| A4 | VBUS | USB Type C Power | VBUS | B9 |
| A3 | TX1− | USB3.1TX1 Differential Pair    USB3.1RX1 Differential Pair | RX1− | B10 |
| A2 | TX1+ |  | RX1+ | B11 |
| A1 | GND | Ground | GND | B12 |

TABLE 2

| A12 | A11 | A10 | A9 | A8 | A7 | A6 | A5 | A4 | A3 | A2 | A1 |
|---|---|---|---|---|---|---|---|---|---|---|---|
| GND | RX2+ | RX2− | VBUS | SBU1 | D+ | D− | CC | VBUS | TX1− | TX1+ | GND |

USB Type C Plug Pin Definition

| GND | TX2+ | TX2− | VBUS | VCONN |  | SBU2 | VBUS | RX1− | RX1+ | GND |
|---|---|---|---|---|---|---|---|---|---|---|
| B1 | B2 | B3 | B4 | B5 | B6 B7 | B8 | B9 | B10 | B11 | B12 |

USB Type-C Connector Interface

| Pin | Name | Description | Name | Pin |
|---|---|---|---|---|
| A1 | GND | Ground | GND | B12 |
| A2 | TX1+ | USB3.1TX1 Differential Pair    USB 31RX1 Differential Pair | RX1+ | B11 |
| A3 | TX1− |  | RX1− | B10 |
| A4 | VBUS | USB Type-C Power | VBUS | B9 |
| A5 | CC | Configuration Channel    Sideband Use Channel-2 | SBU2 | B8 |
| A6 | D+ | USB2.0 Differential Pair    N.C. |  | B7 |
| A7 | D− |  |  | B6 |
| A8 | SUB1 | Sideband Use Channel-1    Power for Powered Cable | VCONN | B5 |
| A9 | VBUS | USB Type-C Power | VBUS | B4 |
| A10 | RX2− | USB3.1RX2 Differential Pair    USB3.1TX2 Differential Pair | TX2− | B3 |
| A11 | RX2+ |  | TX2+ | B2 |
| A12 | GND | Ground | GND | B1 |

Table 1 and Table 2 shows signal definitions and distributions of the USB Type-C interfaces (including a socket and a plug). Whether CC1 or CC2 in the socket is connected to a CC in the plug can be determined once a normal plugging or a reverse plugging is determined, to transmit a USB-PD protocol message coded by the BMC. Only the CC is used herein, and signals on other pins are irrelevant to the present disclosure.

Figure 4:
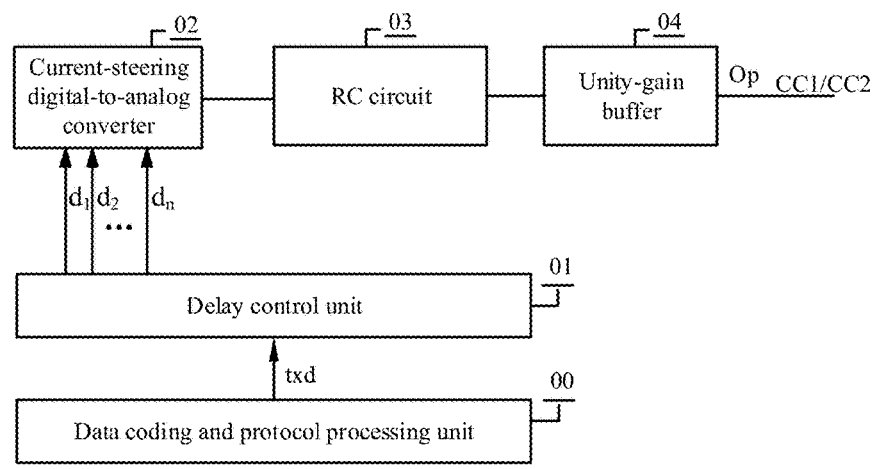
FIG. 4 is a schematic structural diagram of a BMC transmitter according to an embodiment of the present disclosure.

As shown in FIG. 4, a BMC transmitter is provided according to an embodiment of the present disclosure. The BMC transmitter includes a delay control unit 01, a current-steering digital-to-analog converter 02, a RC circuit 03 and a unity-gain buffer 04.

Figure 5:
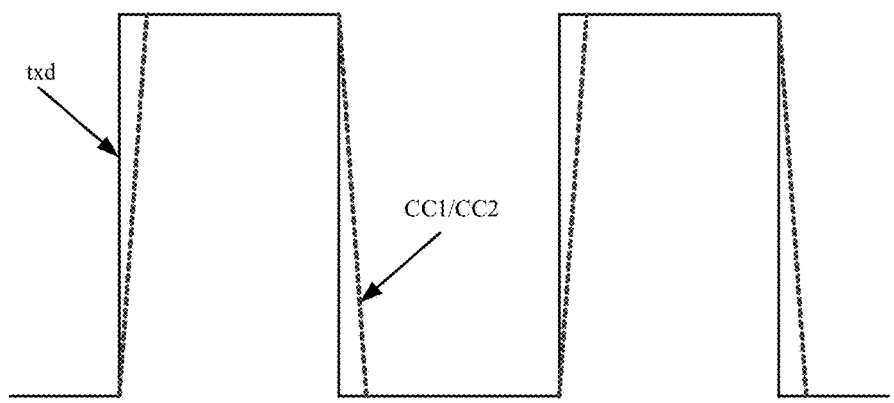
FIG. 5 is a schematic diagram showing an input waveform and an output waveform of a BMC transmitter according to an embodiment of the present disclosure.

In FIG. 4, an input end of the delay control unit 01 is connected to a data coding and protocol processing unit 00, to receive a to-be-transmitted data txd file obtained by the data coding and protocol processing unit 00 performing a coding, a Cyclical Redundancy Check (CRC) and a USB-PD protocol layer control. The delay control unit 01 performs an equal-interval sampling on the to-be-transmitted data txd file to obtain n data signals at an equal interval and sends the signals to the current-steering digital-to-analog converter 02, where n is a positive integer greater than or equal to 2. An input end of the current-steering digital-to-analog converter 02 is connected to an output end of the delay control unit 01, and an input end of the RC circuit 03 is connected to an output end of the current-steering digital-to-analog converter 02. Current units in the current-steering digital-to-analog converter 02 are switched on or switched off successively under the control of the n data signals at the equal interval to charge or discharge the RC circuit 03 to obtain accurately-controlled conversion time. An output end of the RC circuit 03 is connected to an input end of the unity-gain buffer 04. The unity-gain buffer 04 is configured to drive the data with the controlled conversion time to a CC to generate an output waveform. An output end of the unity-gain buffer 04 serves as an output end of the BMC transmitter to output the output waveform. Reference is made to FIG. 5, which is a schematic diagram showing an input waveform and an output waveform of a BMC transmitter according to an embodiment of the present disclosure. In the figure, a solid line represents an input waveform and a dashed line represents an output waveform.

Figure 6:
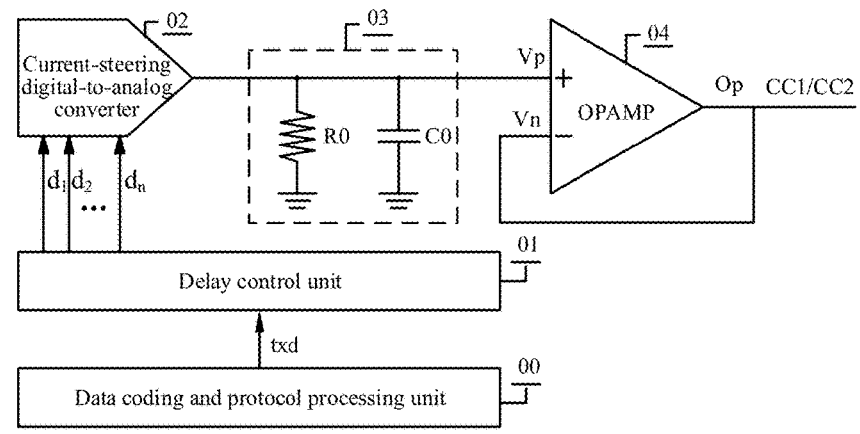
FIG. 6 is a schematic structural diagram of a circuit of a BMC transmitter according to an embodiment of the present disclosure.
Figure 7:
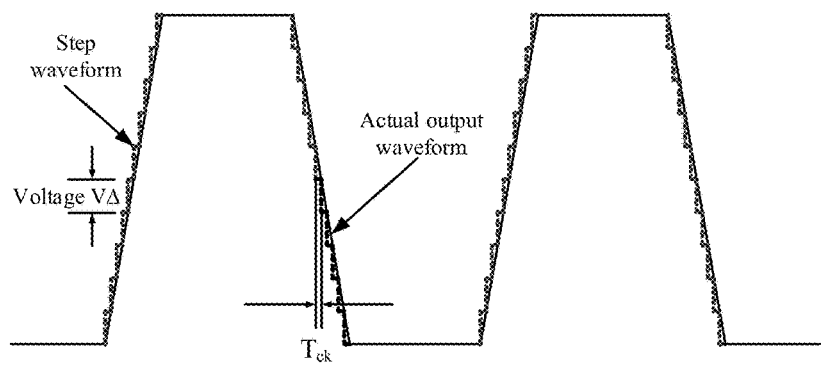
FIG. 7 is a schematic diagram showing an output waveform of a BMC transmitter according to an embodiment of the present disclosure.

It should be noted that, as shown in FIG. 6, the delay control unit 01, the current mode digital-to-analog converter 01, the RC circuit 03 and the unity gain buffer 04 are core assemblies of the BMC transmitter. The data coding and protocol processing unit 00 is configured to perform a coding, a CRC and a USB-PD protocol layer control on to-be-transmitted data txd. The delay control unit 01 is configured to receive to-be-transmitted data txd transmitted from the data coding and protocol processing unit 00, perform an equal-interval sampling on the data to obtain n data signals (d1 to dn) at an equal interval, and transmit the data signals to the current-steering digital-to-analog converter 02. The current units in the current-steering digital-to-analog converter 02 are switched on or switched off successively under the control of the data signals d1 to dn to charge or discharge the RC circuit 03 to obtain a waveform with accurately-controlled rising edges and falling edges. Then, the waveform is driven by the unity-gain buffer 04 to a CC, to form a final BMC transmitting waveform, as shown in FIG. 7.

Figure 8:
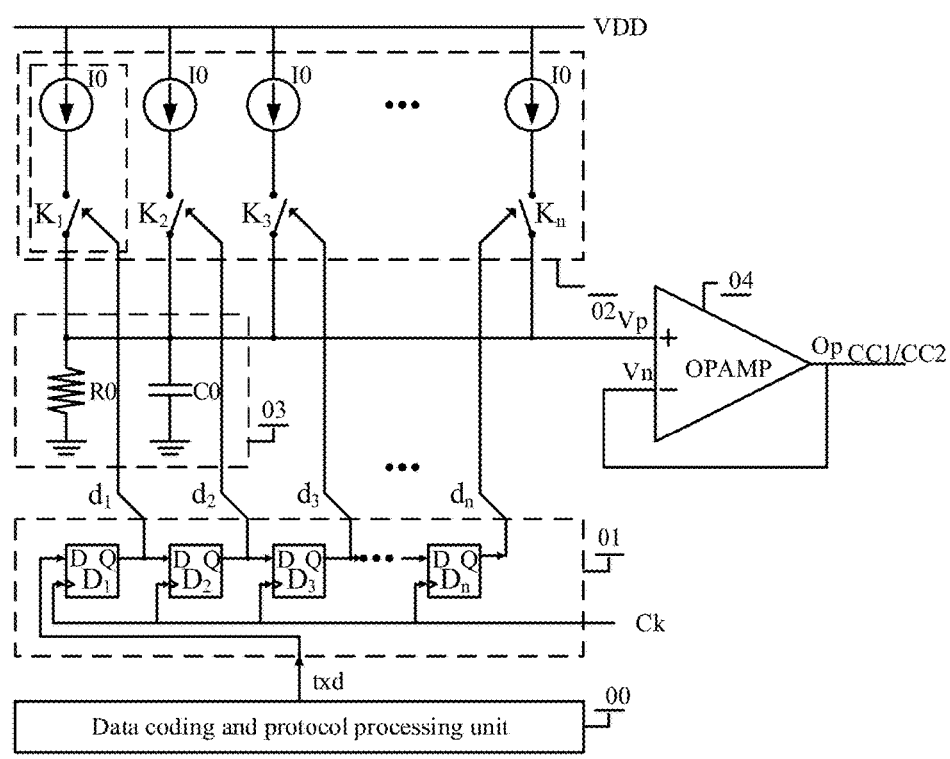
FIG. 8 is a schematic structural diagram of a circuit of a BMC transmitter according to an embodiment of the present disclosure.

Reference is made to FIG. 8, in which inner structures of the delay control unit 01 and the current mode digital-to-analog converter 02 are shown in detail based on FIG. 4 and FIG. 6.

As shown in FIG. 8, the delay control unit 01 includes n D-triggers (D1, D2, . . . , Dn). The n D-triggers are connected in cascade. An input to the D-trigger of each stage is from an output of the D-trigger of a previous stage, and an output end of the D-trigger of each stage serves as the output end of the delay control unit and is connected to the input end of the current-steering digital-to-analog converter. An input end of the D-trigger of the first stage serves as the input end of the delay control unit and is connected to an output end of the data coding and protocol processing unit. The n D-triggers are configured to generate n data signals at an interval of Tck under a control of a clock CK, and transmit the n data signals at the interval of Tck to the current-steering digital-to-analog converter 02.

It should be noted that, a total of n txd outputs at an interval of Tck are generated by the delay control unit 01, namely d1=1*Tck, d2=2*Tck, . . . , dn=n*Tck, where Tck is a period of a clock signal ck. As shown in FIG. 7, a solid line represents an actual output waveform after filtered by a capacitor, and a dashed line represents a step waveform.

As shown in FIG. 8, the current-steering digital-to-analog converter 02 includes n current switch arrays. As shown in the dashed block in the current switch arrays in FIG. 8, each of the current switch arrays includes a current source and a bidirectional switch, and a magnitude of the current of each of the current switch arrays is I0. An end of each of the current switch arrays is connected to a power source VDD, one end of each bidirectional switch serves as the input end of the current-steering digital-to-analog converter 02 and is connected to the output end of the delay control unit 01, and the other end of the bidirectional switch serves as the output end of the current-steering digital-to-analog converter 02 and is connected to the input end of the RC circuit 03. As shown in FIG. 7, switch control signals of the current switch arrays correspond to the data signals d1 to dn transmitted by the delay control unit 01. Under the control of the data signals d1 to dn, the n current switch arrays are switched on or switched off successively and output currents are increased or reduced gradually.

The RC circuit is charged and discharged by the output current of the current-steering digital-to-analog converter 02. A time step of the charging or discharging is equal to the clock period Tck, and a voltage step of the charging or discharging is $\Delta V = I0*R0$. In this case, a step waveform is formed at an output end of the current-steering digital-to-analog converter 02, which is then filtered by a capacitor to form smooth rising edges and falling edges, as shown in FIG. 7. Finally, the output of the current-steering digital-to-analog converter 02 is driven by the unity-gain buffer 04 to a CC, to generate an output waveform.

Figure 9:
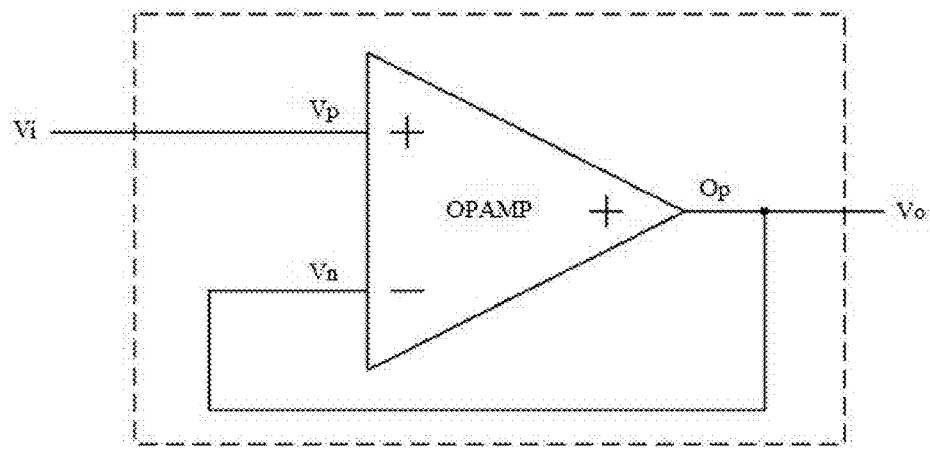
FIG. 9 is a schematic structural diagram of a unity-gain buffer according to an embodiment of the present disclosure.

As shown in FIG. 6 and FIG. 8, the unity-gain buffer 04 may be an operational amplifier OPAMP. As shown in FIG. 9, a positive phase input end Vp of the operational amplifier OPAMP serves as an input end of the unity-gain buffer 04 and is connected to the RC circuit 03, and a reverse phase input end Vn of the operational amplifier OPAMP is connected to an output end Op of the operational amplifier to serve as an output end of the unity-gain buffer 04.

Figure 10:
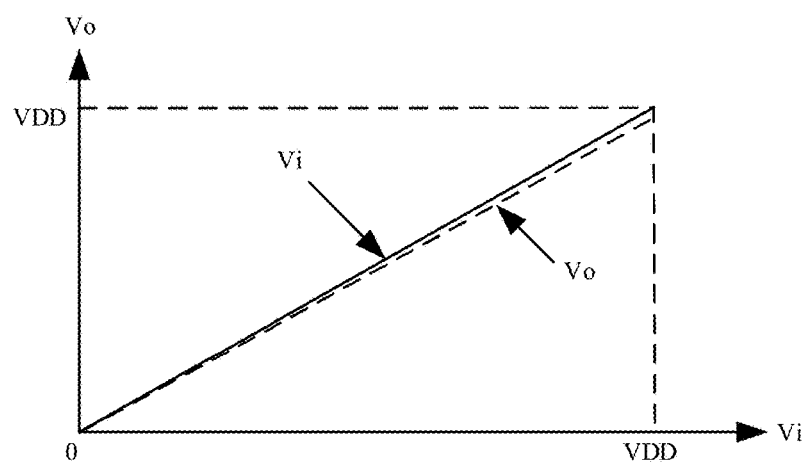
FIG. 10 is a schematic diagram of an input-output following feature of a unity-gain buffer according to an embodiment of the present disclosure.

It should be noted that, since the operational amplifier OPAMP generally has a high gain, the unity-gain buffer (UGB) has a features that an output follows an input, and has a small output impedance and a strong drive capability, and thus is generally applied to a case requiring separation of an input from an output and requiring a strong drive capability. A gain from the input of the UGB to the output of the UGB may be represented as $A(UGB) = Vo/Vi = A/(A+1)$, where A represents a gain of the operational amplifier OPAMP. Since A is great (A is much greater than 1 and generally has a value equal to or greater than 100), i.e., $A(UGB) \approx 1$, which presents the following feature. Reference is made to FIG. 10, which is a schematic diagram showing a typical input-output following feature of the UGB. In the figure, a solid line represents an input voltage, and a dashed line represents an output voltage.

In the BMC transmitter according to the embodiment of the present disclosure, the delay control unit performs the equal-interval delay processing on data transmitted by the data coding and protocol processing unit. Then, the current-steering digital-to-analog converter is controlled to charge or discharge the resistance-capacitance (RC) circuit to obtain accurately-controlled conversion time. Data with the controlled conversion time is driven to a CC by the unity-gain buffer to generate an output waveform. The technical solution solves the technical problem of a mutual influence between power source systems of a traditional BMC transmitter which is a digital module and a traditional BMC receiver which is an analog module, and the technical problem of a large noise of a power switch and large consumption of chip area and power which are resulted from digital buffers driven by equal-interval data or clocks in a traditional BMC transmitter.

It should be further noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, an article or device including a series of elements includes not only the elements but also other elements that are not enumerated, or also include the elements inherent to the article or device. Unless expressively limited otherwise, the statement "comprising (including) a . . . " does not exclude the case that other similar elements may exist in the article or device.

The above illustration of the disclosed embodiments helps those skilled in the art to implement or practice the technical solution in the present disclosure. Many changes to these embodiments are apparent for those skilled in the art, and general principles defined herein can be implemented in other embodiments without departing from the spirit or scope of the present disclosure. Hence, the present disclosure is not limited to the embodiments disclosed herein, but is to conform to the widest scope consistent with principles and novel features disclosed herein.

The invention claimed is:

1. A biphase mark coding transmitter, comprising:
a delay control unit;
a current-steering digital-to-analog converter;
a resistance-capacitance circuit; and
a unity-gain buffer, wherein
an input end of the delay control unit is connected to a data coding and protocol processing unit, the delay control unit is configured to receive a to-be-transmitted data txd file obtained by the data coding and protocol processing unit performing a coding, a cyclical redundancy check and a universal serial bus power delivery (USB-PD) protocol layer control, perform an equal-interval sampling on the to-be-transmitted data txd file to obtain n data signals at an equal interval, and transmit the n data signals to the current-steering digital-to-analog converter, where n is a positive integer greater than or equal to 2;
an input end of the current-steering digital-to-analog converter is connected to an output end of the delay control unit, an input end of the resistance-capacitance circuit is connected to an output end of the current-steering digital-to-analog converter, current units in the current-steering digital-to-analog converter are switched on or switched off successively under the control of the n data signals at the equal interval, to charge or discharge the resistance-capacitance circuit to obtain accurately-controlled conversion time; and
an output end of the resistance-capacitance circuit is connected to an input end of the unity-gain buffer, the unity-gain buffer is configured to drive the data with the controlled conversion time to a configuration channel to generate an output waveform, an output end of the unity-gain buffer serves as an output end of the biphase mark coding transmitter to output the output waveform.

2. The biphase mark coding transmitter according to claim 1, wherein the delay control unit comprises n D-triggers, wherein,
the n D-triggers are connected in cascade, an input to the D-trigger of each stage is from an output of the D-trigger of a previous stage, and an output end of the D-trigger of each stage serves as the output end of the delay control unit and is connected to the input end of the current-steering digital-to-analog converter, and an input end of the D-trigger of the first stage serves as the input end of the delay control unit and is connected to an output end of the data coding and protocol processing unit; and
the n D-triggers are configured to generate the n data signals at the equal interval under a control of a clock, and transmit the n data signals at the equal interval to the current-steering digital-to-analog converter.

3. The biphase mark coding transmitter according to claim 2, wherein the current-steering digital-to-analog converter comprises n current switch arrays, and each of the n current switch arrays comprises a current source and a bidirectional switch, wherein
an end of each of the current switch arrays is connected to a power source, one end of the bidirectional switch serves as the input end of the current-steering digital-to-analog converter and is connected to the output end of the delay control unit, and the other end of the bidirectional switch serves as the output end of the current-steering digital-to-analog converter and is connected to the input end of the resistance-capacitance circuit.

4. The biphase mark coding transmitter according to claim 1, wherein the unity-gain buffer is an operational amplifier, a positive phase input end of the operational amplifier serves as the input end of the unity-gain buffer and is connected to the resistance-capacitance circuit, and a negative phase input end of the operational amplifier is connected to an output end of the operational amplifier to serve as the output end of the unity-gain buffer.

* * * * *